US009716093B1

(12) United States Patent
Chang et al.

(10) Patent No.: US 9,716,093 B1
(45) Date of Patent: Jul. 25, 2017

(54) SEMICONDUCTOR DEVICE

(71) Applicant: Taiwan Semiconductor Manufacturing Co., Ltd., Hsinchu (TW)

(72) Inventors: Che-Cheng Chang, Hsinchu (TW); Chih-Han Lin, New Taipei (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/062,224

(22) Filed: Mar. 7, 2016

(51) Int. Cl.
*H01L 27/092* (2006.01)
*H01L 29/423* (2006.01)
*H01L 29/49* (2006.01)

(52) U.S. Cl.
CPC .... *H01L 27/0924* (2013.01); *H01L 29/42376* (2013.01); *H01L 29/4983* (2013.01)

(58) Field of Classification Search
CPC ............. H01L 27/0924; H01L 29/4983; H01L 29/42376
See application file for complete search history.

(56) References Cited

U.S. PATENT DOCUMENTS 9,048,219 B2 * 6/2015 Kim .................... H01L 27/0924
9,287,181 B2 * 3/2016 Tseng ............. H01L 21/823857
9,324,820 B1 * 4/2016 Kelly ............. H01L 21/823437

* cited by examiner

*Primary Examiner* — Roy Potter
*Assistant Examiner* — Paul Patton
(74) *Attorney, Agent, or Firm* — Jianq Chyun IP Office

(57) ABSTRACT

A semiconductor device including a substrate, insulators, a gate dielectric layer, a first gate structure and a second gate structure is provided. The substrate includes trenches, a first semiconductor fin and a second semiconductor fin. The first gate structure is disposed on the gate dielectric layer and partially covers the first semiconductor fin. The first gate structure includes a first metal gate and a first dielectric cap covering the first metal gate. The second gate structure is disposed on the gate dielectric layer and partially covers the second semiconductor fin. The second gate structure includes a second metal gate and a second dielectric cap covering the second metal gate. Work function of the first metal gate is smaller than work function of the second metal gate and thickness of the first dielectric cap is smaller than thickness of the second dielectric cap.

20 Claims, 18 Drawing Sheets

SEMICONDUCTOR DEVICE

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, to achieve n-type FinFETs and p-type FinFETs with low and symmetrical threshold voltages ($V_{th}$), different work function metals are used in metal gate fabrication of n-type FinFETs and p-type FinFETs. During the current metal gate etch back process, yield rate and reliability of the FinFETs may deteriorate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
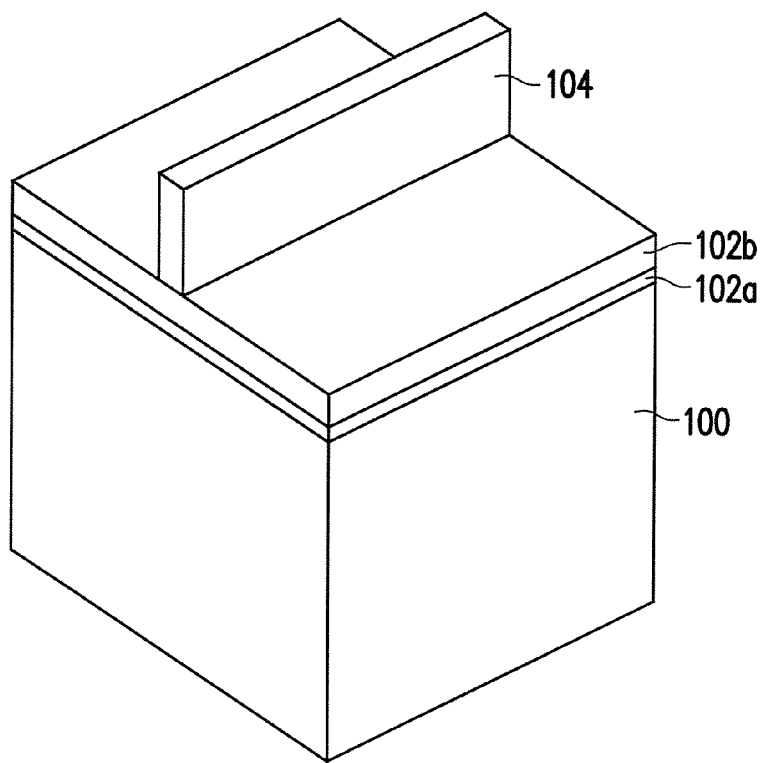
FIGS. 1A-1K are perspective views of a method for fabricating an n-type FinFETs of a semiconductor device in accordance with some embodiments.
Figure 1B:
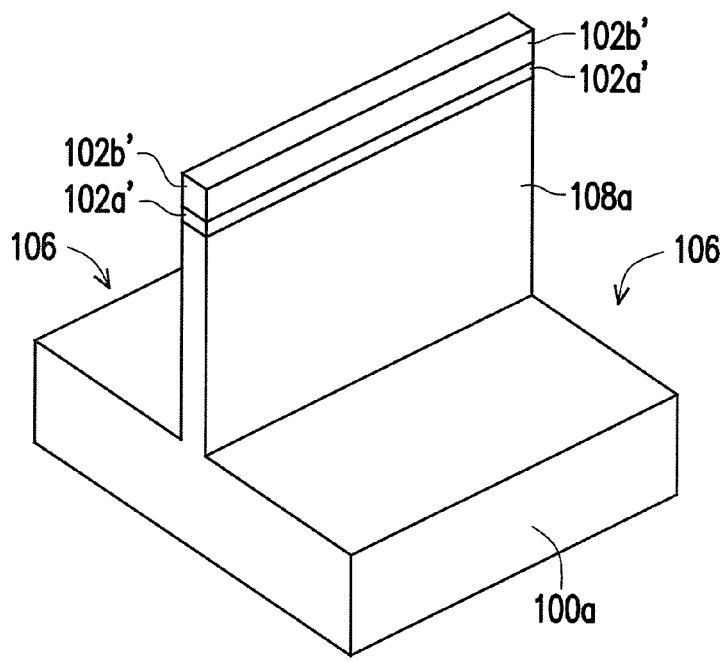
Figure 1C:
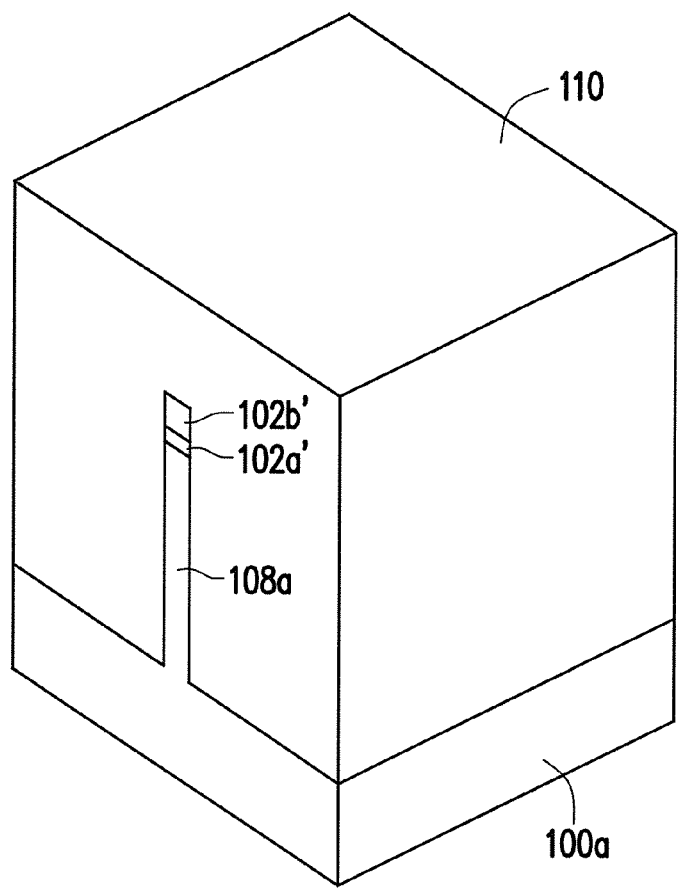

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a FinFET. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIGS. 1A-1K are perspective views of a method for fabricating an n-type FinFETs of a semiconductor device in accordance with some embodiments and FIGS. 2A-2K are perspective views of a method for fabricating a p-type FinFETs of a semiconductor device in accordance with some embodiments.

Figure 2A:
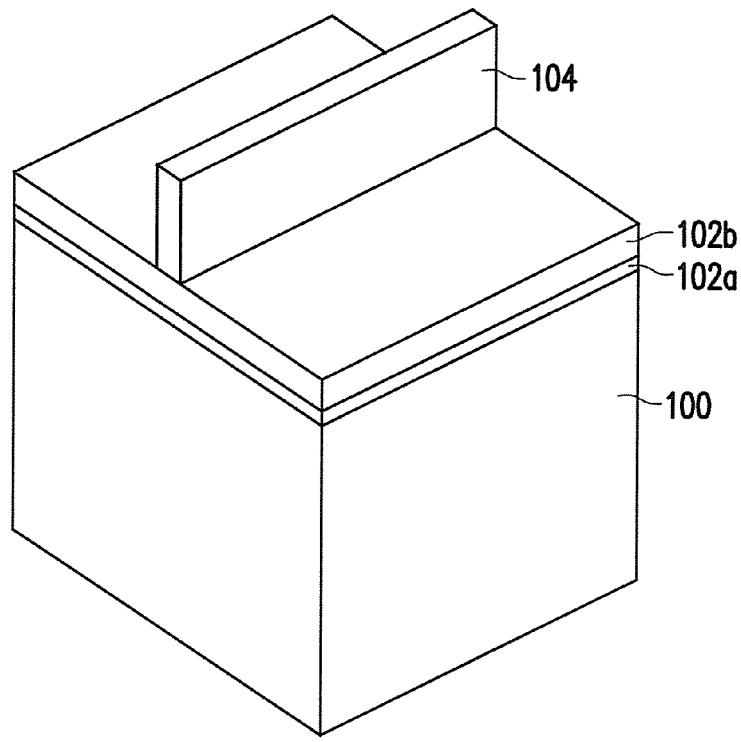
FIGS. 2A-2K are perspective views of a method for fabricating a p-type FinFETs of a semiconductor device in accordance with some embodiments.

Referring to FIG. 1A and FIG. 2A, a substrate 100 is provided. In one embodiment, the substrate 100 includes a crystalline silicon substrate (e.g., wafer). The substrate 100 may comprise various n-type and p-type doped regions depending on design requirements. The portion of the substrate 100 shown in FIG. 1A is doped with n-type dopants while the portion of the substrate 100 shown in FIG. 2A is doped with p-type dopants. For example, the p-type dopants may be boron or BF, or combinations thereof while the n-type dopants may be phosphorus, arsenic or combinations thereof. In some embodiments, the substrate 100 including n-type and p-type doped regions may be an n-type substrate having p-type doped regions (e.g., p-wells) formed therein or a p-type substrate having n-type doped regions (e.g., n-wells) formed therein. In some alternative embodiments, the substrate 100 including n-type and p-type doped regions may be made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 102a and a mask layer 102b are sequentially formed on the n-type region (shown in FIG. 1A) and p-type doped region (shown in FIG. 2A) of the substrate 100. The pad layer 102a may be a silicon oxide thin film formed, for example, by thermal oxidation process. The pad layer 102a may act as an adhesion layer between the substrate 100 and mask layer 102b. The pad layer 102a may also act as an etch stop layer for etching the mask layer 102b. For example, the mask layer 102b is a silicon nitride layer formed by low-pressure chemical vapor deposition (LP-CVD) or plasma enhanced chemical vapor deposition (PECVD). The mask layer 102b is used as a hard mask during subsequent photolithography processes. Then, a patterned photoresist layer 104 having a predetermined pattern is formed on the mask layer 102b.

Figure 2B:
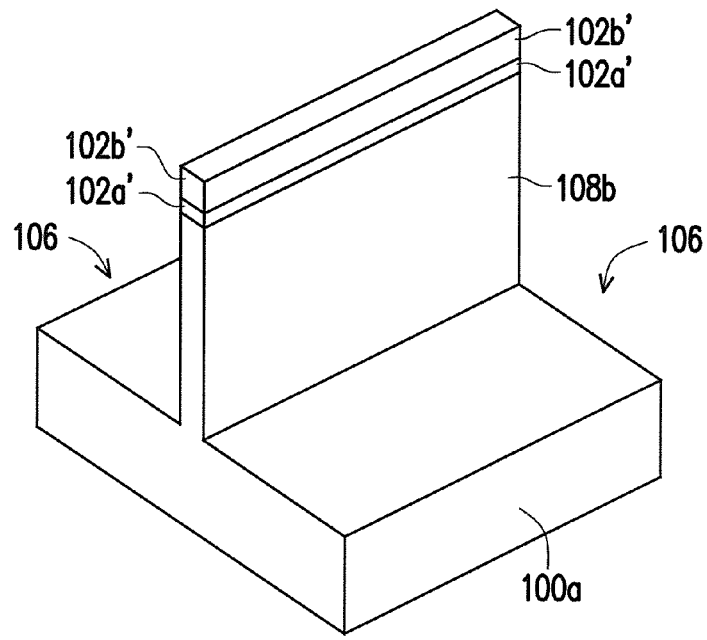

Referring to FIGS. 1A-1B and FIGS. 2A-2B, the mask layer 102b and the pad layer 102a which are not covered by the patterned photoresist layer 104 are sequentially etched to form a patterned mask layer 102b' and a patterned pad layer 102a' so as to expose underlying substrate 100. By using the patterned mask layer 102b', the patterned pad layer 102a' and the patterned photoresist layer 104 as a mask, the substrate 100 is patterned to form a patterned substrate 100a. Portions of the substrate 100 exposed by the patterned mask layer 102b', the patterned pad layer 102a' and the patterned photoresist layer 104 are etched to form trenches 106, at least one first semiconductor fin 108a formed in the n-type region (shown in FIG. 1B) and at least one second semiconductor fin 108b formed in the p-type region (shown in FIG. 2B). The first semiconductor fin 108a is an n-type semiconductor fin and the second semiconductor fin 108b is a p-type semiconductor fin. The number of the first semiconductor fin 108a shown in FIG. 1B and the second semiconductor fin 108b shown in FIG. 2B is merely for illustration, in some alternative embodiments, two or more first semiconductor fins 108a and second semiconductor fins 108b may be formed in accordance with actual design requirements. After the substrate 100 is patterned, the first semiconductor fin 108a and the second semiconductor fin 108b are covered by the patterned mask layer 102b', the patterned pad layer 102a' and the patterned photoresist layer 104. Two adjacent trenches 106 formed in the n-type region (shown in FIG. 1B) of the substrate 100 are spaced from each other by the first semiconductor fin 108a and two adjacent trenches 106 formed in the p-type region (shown in FIG. 2B) of the substrate 100 are spaced from each other by the second semiconductor fin 108b.

The height of the first and second semiconductor fins 108a, 108b and the depth of the trench 106 range from about 5 nm to about 500 nm. After the first semiconductor fin 108a, the second semiconductor fin 180b and the trenches 106 are formed, the patterned photoresist layer 104 is then removed. In one embodiment, a cleaning process may be performed to remove a native oxide of the patterned substrate 100a. The cleaning process may be performed using diluted hydrofluoric (DHF) acid or other suitable cleaning solutions.

Figure 2C:
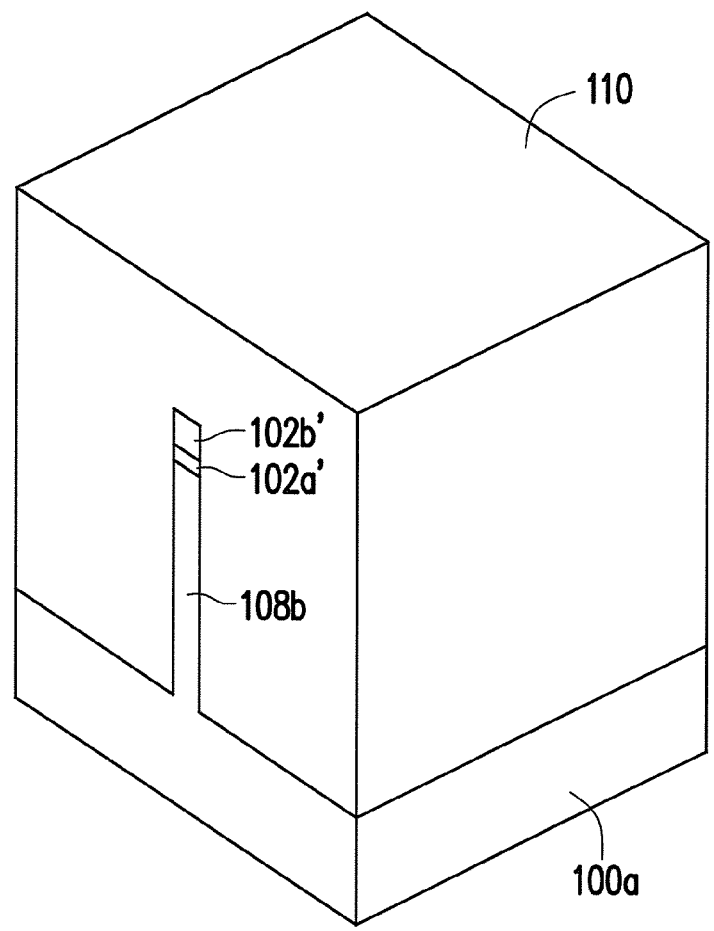

Referring to FIGS. 1B-1C and FIGS. 2B-2C, an insulating material 110 are formed over the patterned substrate 100a to cover the first semiconductor fin 108a formed in the n-type region (shown in FIG. 1C) and the second semiconductor fin 108b formed in the p-type region (shown in FIG. 2C). Furthermore, the insulating material 110 fills the trenches 106. In addition to the first semiconductor fin 108a and the second semiconductor fin 108b, the insulating material 110 further covers the patterned pad layer 102a' and the patterned mask layer 102b'. The insulating material 110 includes silicon oxide, silicon nitride, silicon oxynitride, a spin-on dielectric material, or a low-K dielectric material, for example. The insulating material 110 may be formed by high-density-plasma chemical vapor deposition (HDP-CVD), sub-atmospheric CVD (SACVD) or spin-on.

Figure 1D:
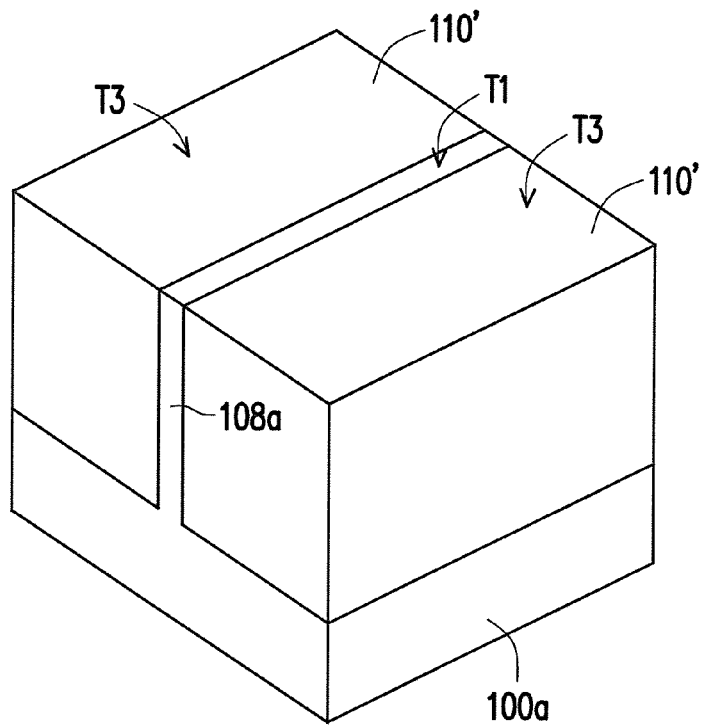
Figure 1E:
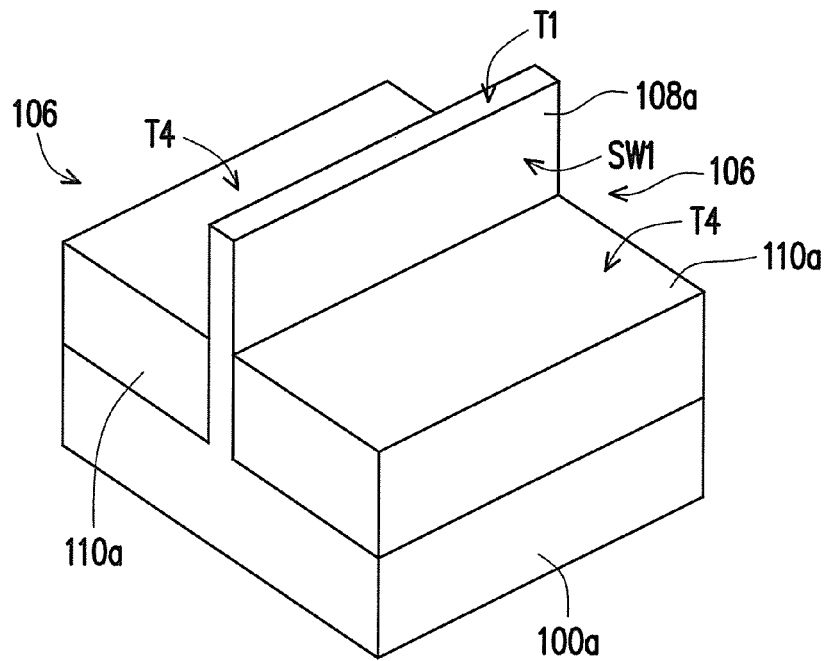
Figure 1F:
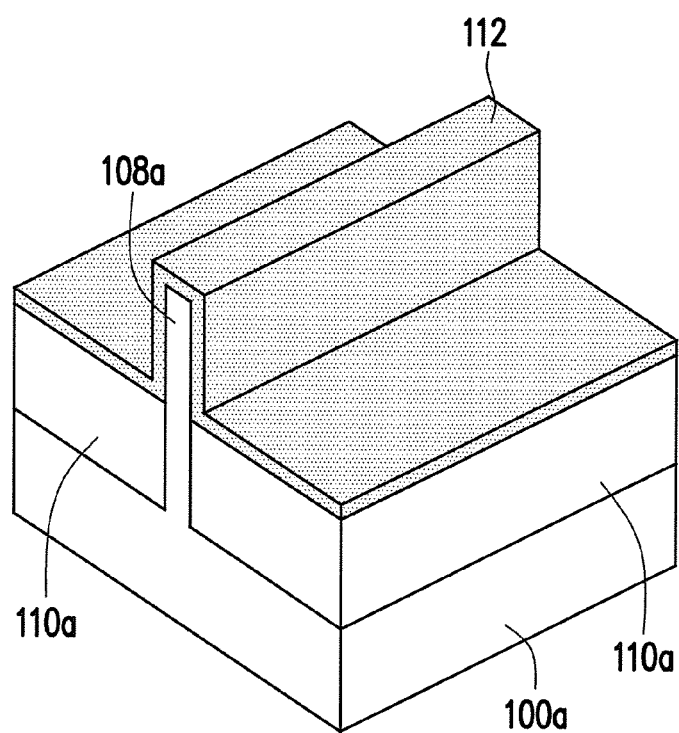
Figure 2D:
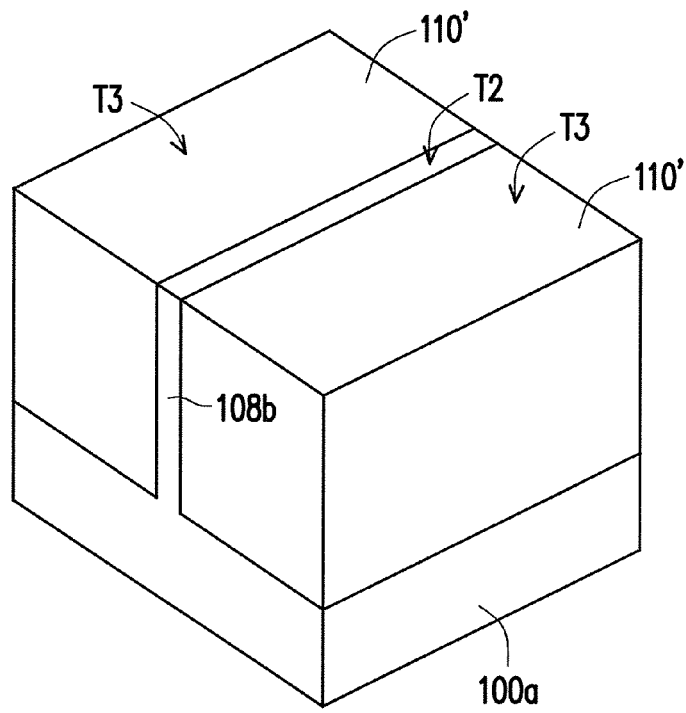
Figure 2E:
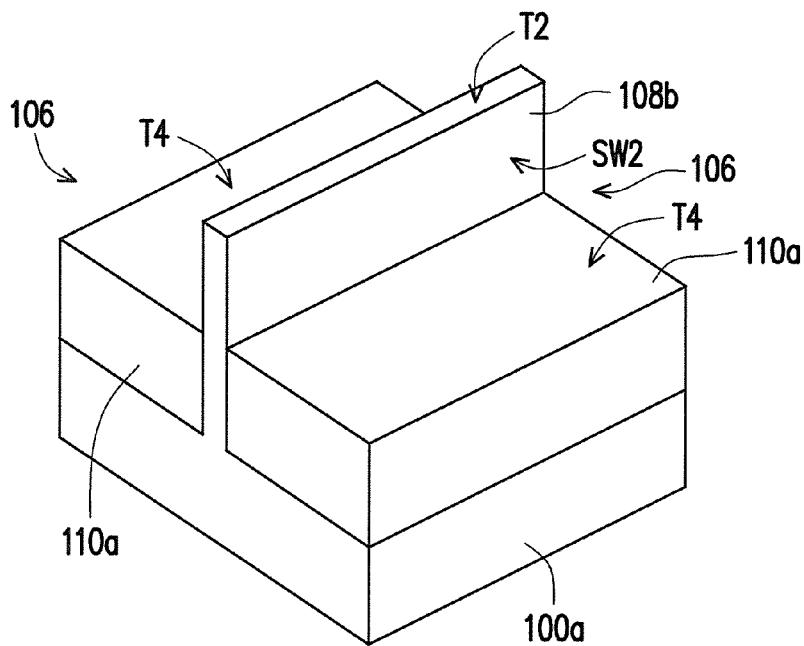
Figure 2F:
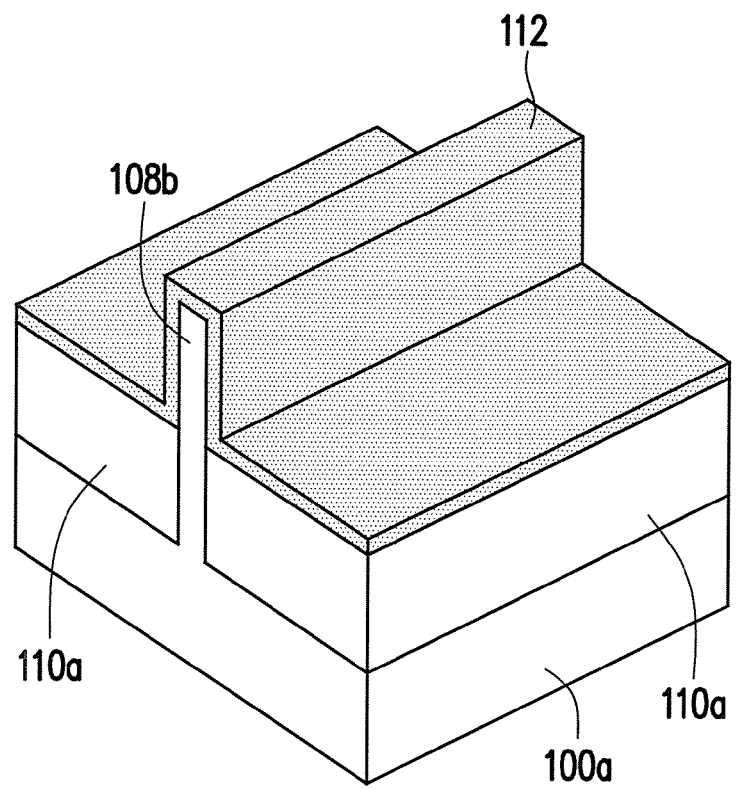

Referring to FIGS. 1C-1D and FIGS. 2C-2D, a chemical mechanical polish process is, for example, performed to remove a portion of the insulating material 110, the patterned mask layer 102b' and the patterned pad layer 102a' until top surfaces T1 and T2 of the first semiconductor fin 108a and the second semiconductor fin 108b are exposed. As shown in FIG. 1D and FIG. 2D, after the insulating material 110 is polished, a polished insulating material 110' is formed and top surfaces T3 of the polished insulating material 110' are substantially coplanar with the top surface T1 of the first semiconductor fin 108a and the top surface T2 of the second semiconductor fin 108b.

Referring to FIGS. 1D-1E and FIGS. 2D-2E, the polished insulating material 110' is partially removed by an etching process such that insulators 110a are formed on the patterned substrate 100a and each insulator 110a is located in one of the trenches 106 correspondingly. In some embodiments, the etching process may be a wet etching process with hydrofluoric acid (HF) or a dry etching process. Top surfaces T4 of the insulators 110a are lower than the top surface T1 of the first semiconductor fin 108a and the top surface T2 of the second semiconductor fin 108b. In other words, the first and second semiconductor fins 108a, 180b protrude from the top surfaces T4 of the insulators 110a and sidewalls SW1, SW2 of the first and second semiconductor fins 108a, 108b are thus exposed.

Referring to FIGS. 1E-1F and FIGS. 2E-2F, after the insulators 110a are formed, a gate dielectric layer 112 is formed to conformally cover the top surfaces T4 of the insulators 110a, the top surface T1, T2 of the first and second semiconductor fins 108a, 108b and the sidewalls SW1, SW2 of the first and second semiconductor fins 108a, 108b. In some embodiments, the gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 112 is a high-k dielectric layer with a thickness in the range of about 0.2 nm to 50 nm. The gate dielectric layer 112 may be formed by a suitable process such as atomic layer deposition (ALD), chemical vapor deposition (CVD), physical vapor deposition (PVD), thermal oxidation or UV-ozone oxidation.

Figure 1G:
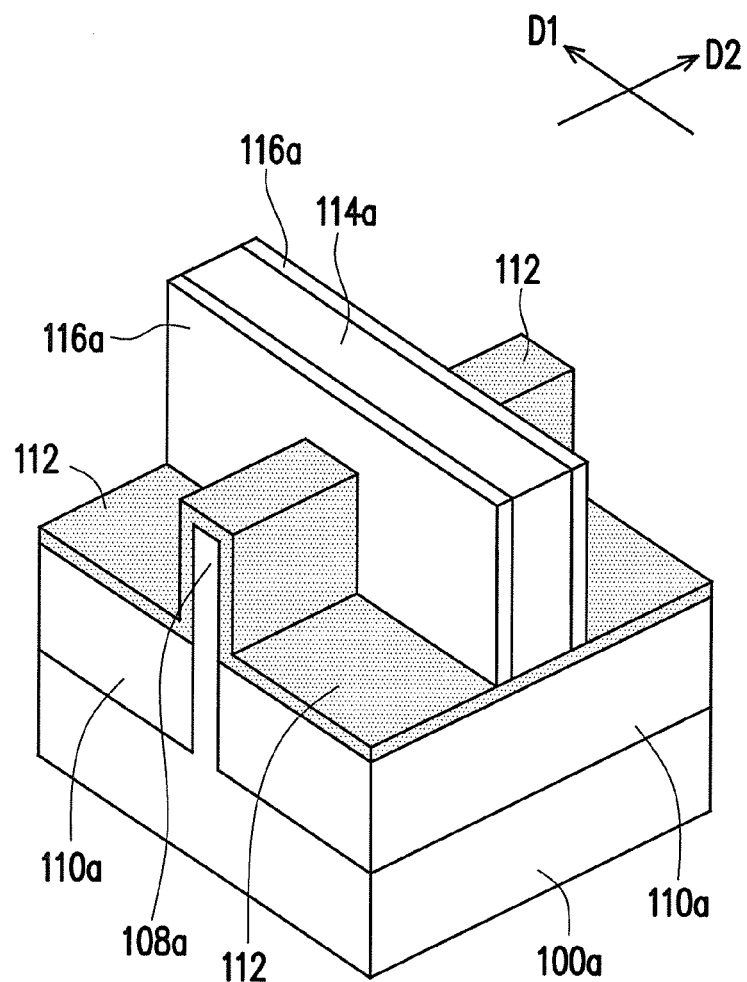
Figure 2G:
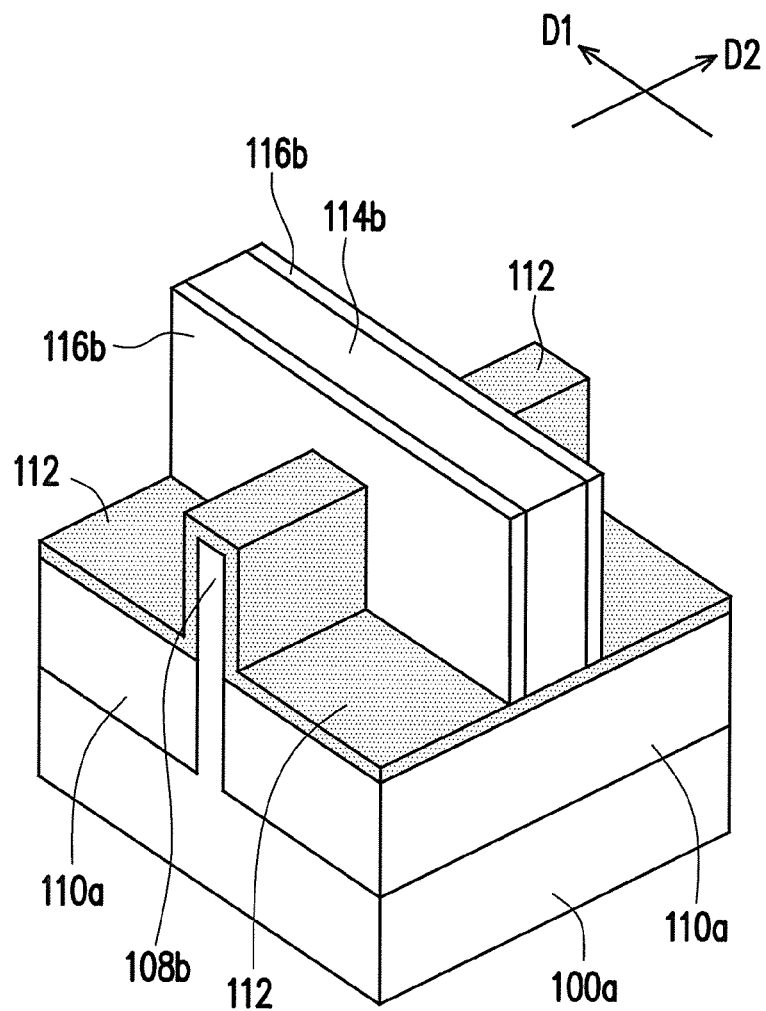

Referring to FIGS. 1F-1G and FIGS. 2F-2G, at least one first dummy gate strip 114a and at least one second dummy gate strip 114 are formed on the gate dielectric layer 112, wherein the first dummy gate strip 114a partially covers the first semiconductor fin 108a while the second dummy gate strip 114b partially covers the second semiconductor fin 108b. A lengthwise direction D1 of the first and second dummy gate strips 114a, 114b is different from a lengthwise direction D2 of the first and second semiconductor fins 108a, 108b. In some embodiments, the lengthwise direction D1 of the first and second dummy gate strips 114a, 114b is perpendicular to the lengthwise direction D2 of the first and second semiconductor fins 108a, 108b. The number of the first and second dummy gate strips 114a, 114b shown in FIG. 1G and FIG. 2G is merely for illustration, in some alternative embodiments, more dummy gate strips may be formed in accordance with actual design requirements. The first and second dummy gate strips 114a, 114b include silicon-containing material, such as poly-silicon, amorphous silicon or a combination thereof.

As shown in FIG. 1G and FIG. 2G, after the first and second dummy gate strips 114a, 114b are formed, a pair of first spacers 116a and a pair of second spacers 116b are respectively formed on sidewalls of the first and second dummy gate strips 114a, 114b. As shown in FIG. 1G and FIG. 2G, the pair of first spacers 116a and the pair of second spacers 116b are formed on the gate dielectric layer 112 and extend along the sidewalls of the first and second dummy gate strips 114a, 114b. The pair of first spacers 116a and the pair of second spacers 116b are formed of dielectric materials, such as silicon nitride or SiCON. The pair of first spacers 116a and the pair of second spacers 116b may include a single layer or multilayer structure. Since the pair of first spacers 116a are spaced apart by the first dummy gate strip 114a, a gap between the pair of first spacer 116a substantially equals to the width of the first dummy gate strip 114a. Similarly, since the pair of second spacers 116b are spaced apart by the second dummy gate strip 114b, a gap between the pair of second spacer 116b substantially equals to the width of the second dummy gate strip 114b.

Figure 1H:
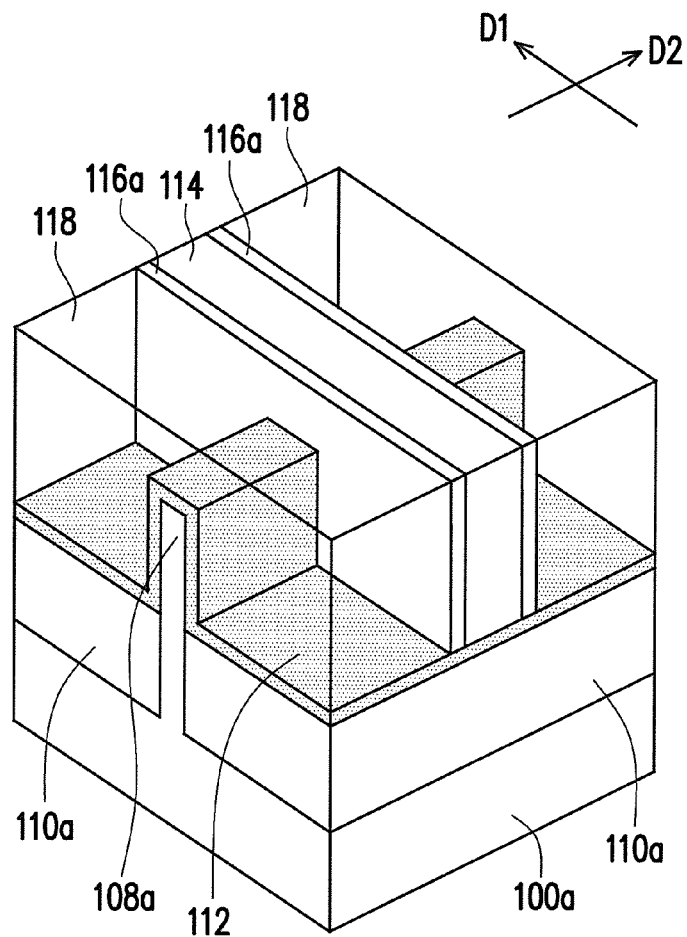
Figure 2H:
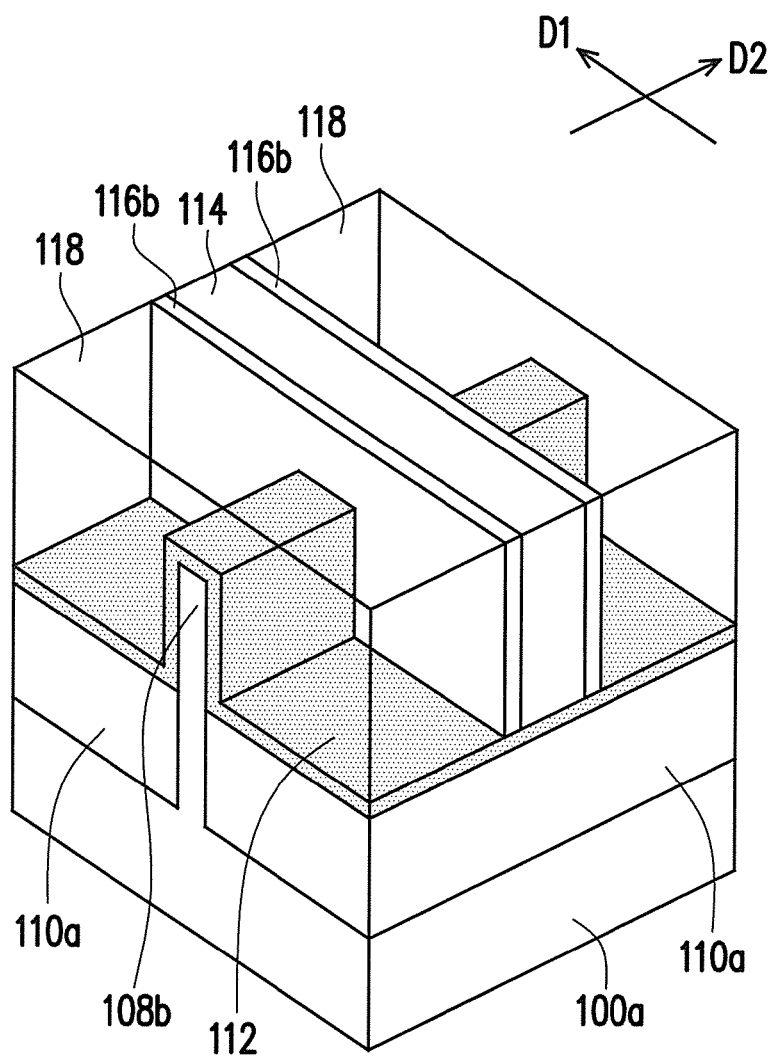
Figure 2I:
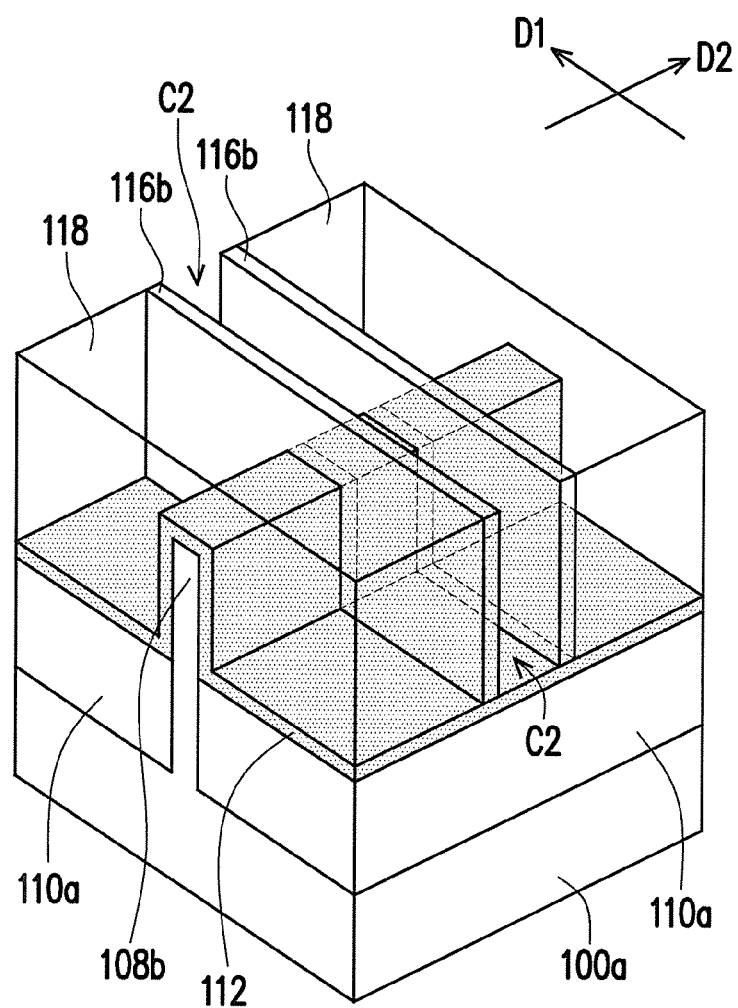

Referring to FIG. 1H and FIG. 2H, a patterned dielectric layer 118 is formed to cover the gate dielectric layer 112 that are not covered by the first and second dummy gate strips 114a, 114b and the first and second spacers 116a, 116b. A top surface of the patterned dielectric layer 118 is substantially coplanar with the top surfaces of the first and second dummy gate strips 114a, 114b. In some embodiments, before the patterned dielectric layer 118 is formed, some processes (e.g., patterning process of gate dielectric layer 112, semiconductor fin recessing process, strained source/drain epitaxial process on the semiconductor fin, silicidation process and so on) may be performed in advance. Details of the aforesaid optional processes are omitted.

Figure 1I:
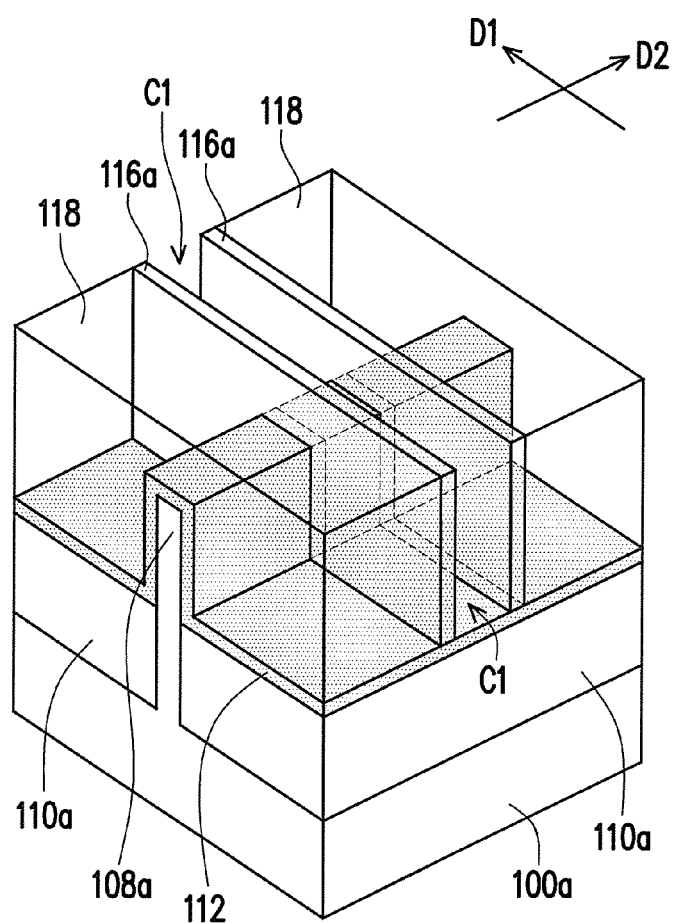

Referring to FIGS. 1H-1I, the first and second dummy gate strips 114a, 114b are removed. In some embodiments, the first and second dummy gate strips 114a, 114b are removed, for example, by an etching process. Through properly selecting of etchant, the first and second dummy gate strips 114a, 114b are removed without damaging the first and second spacers 116a, 116b, the patterned dielectric layers 118 and the gate dielectric layer 112 significantly. After the first and second dummy gate strips 114a, 114b are removed, a first cavity C1 between the pair of first spacers 116a and a second cavity C2 between the pair of second spacers 116b are formed. In other words, the dielectric gate layer 112 is partially exposed by the first cavity C1 and the second cavity C2.

Referring to FIGS. 1I-1J and FIGS. 2I-2J, after the first cavity C1 and the second cavity C2 are formed, the first metal gate 120 is formed in and fills the first cavity C1 and a second metal gate 122 is formed in and fills the second cavity C2. The first metal gate 120 partially covers the first semiconductor fin 108a while the second metal gate 122 partially covers the second semiconductor fin 108b. Work function of the first metal gate 120 is smaller than work function of the second metal gate 122. The first metal gate 120 includes a first work function metal 120a disposed on the gate dielectric layer 112 and a first main metal 120b embedded in the first work function metal 120a. The second metal gate 122 includes a second work function metal 122a disposed on the gate dielectric layer 112 and a second main metal 122b embedded in the second work function metal 122a.

Figure 1J:
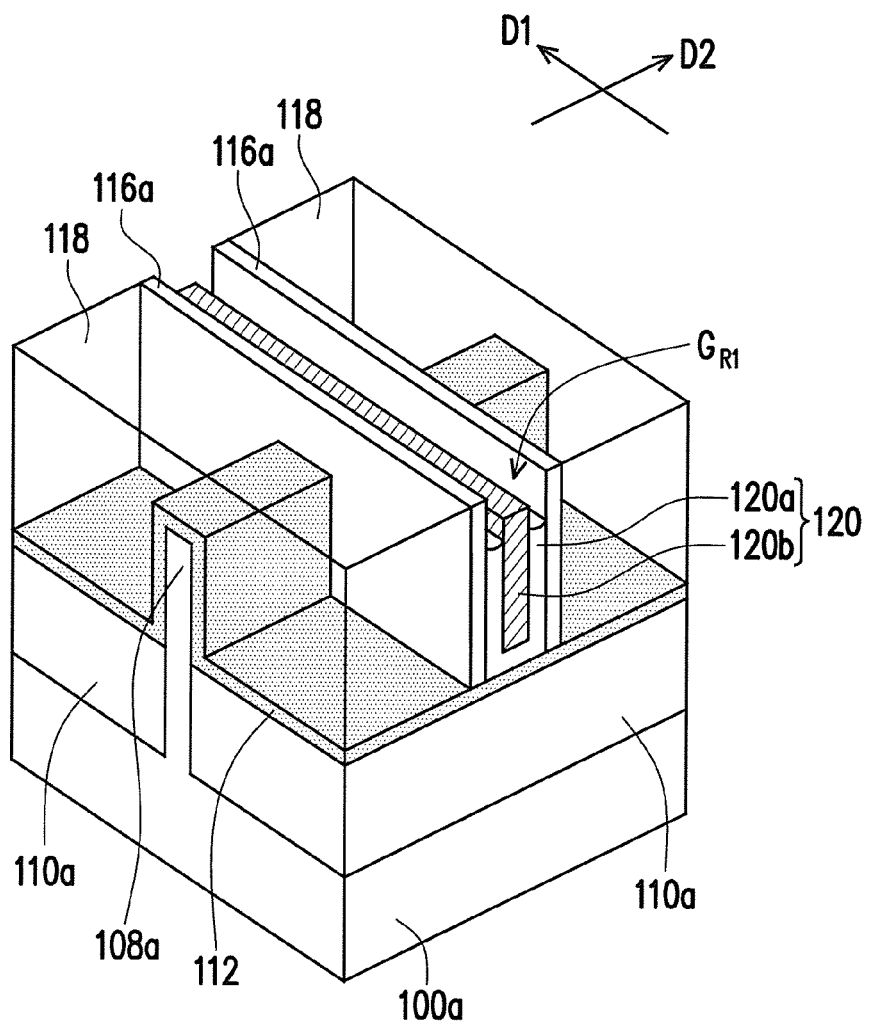

In some embodiments, the first metal gate 120 may be formed by sequentially depositing a first work function metallic layer and a first main metallic layer; polishing the first work function metallic layer and the first main metallic layer outside the first cavity C1; and partially removing the first work function metallic layer and the first main metallic layer in the first cavity C1 through an etch process so as to form the first metal gate 120 and a first gate recess $G_{R1}$ between the pair of first spacers 116a. For example, the first work function metallic layer and the first main metallic layer are back-etched by Ar, $O_2$, $N_2$, He, $SO_2$, $Cl_2$, $SiCl_4$, $SF_6$, $BCl_3$, $NF_3$, HBr, $CH_4$, $CF_4$, $CHF_3$, $CH_2F_2$, $CH_3F$, $C_4F_8$, $C_xH_yF_z$, (x>0, y>0, z>0) or combinations thereof. As shown in FIG. 1J, due to etching selectivity, the first work function metallic layer is etched more efficiently than the first metallic layer and the first main metal 120b protrudes from the top surface of the first work function metal 120a.

Figure 2J:
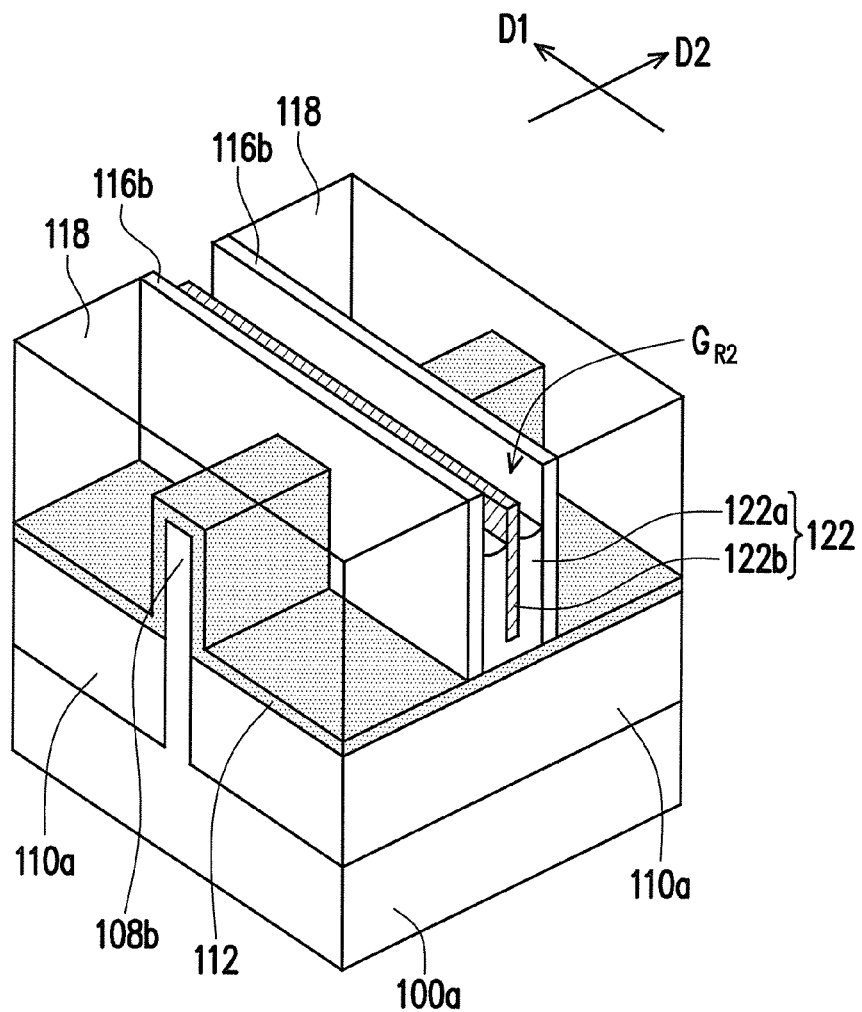

Similarly, the second metal gate 122 may be formed by sequentially depositing a second work function metallic layer and a second main metallic layer; polishing the second work function metallic layer and the second main metallic layer outside the second cavity C2; and partially removing the second work function metallic layer and the second main metallic layer in the second cavity C2 through another etch process so as to form the second metal gate 122 and a second gate recess $G_{R2}$ between the pair of second spacers 116b. For example, the second work function metallic layer and the second main metallic layer are back-etched by Ar, $O_2$, $N_2$, He, $SO_2$, $Cl_2$, $SiCl_4$, $SF_6$, $BCl_3$, $NF_3$, HBr, $CH_4$, $CF_4$, $CHF_3$, $CH_2F_2$, $CH_3F$, $C_4F_8$, $C_xH_yF_z$, (x>0, y>0, z>0) or combinations thereof. As shown in FIG. 2J, due to etch selectivity, the second work function metallic layer is etched more efficiently than the second metallic layer and the second main metal 122b protrudes from the top surface of the second work function metal 122a.

It is noted that, in order to achieve n-type FinFETs and p-type FinFETs with low and symmetrical threshold voltages ($V_{th}$), the second work function metallic layer is thicker than the first work function metallic layer and the second main metallic layer is thinner than the first main metallic layer. Since the second work function metallic layer is thicker than the first main metallic layer, the space for forming the second main metal 122b in the second cavity C2 is smaller than the space for forming the first main metal 120b in the first cavity C1. Accordingly, the width of the first main metal 120b is greater than the width of the second main metal 122b.

As shown in FIG. 1J and FIG. 2J, since the second work function metallic layer is etched more efficiently than the first work function metallic layer, the maximum depth of the second gate recess $G_{R2}$ is greater than the maximum depth of the first gate recess $G_{R1}$.

In some embodiments, the first main metal 120b of the first metal gate 120 and the second main metal 122b of the second metal gate 122 may be made of same material and have same work function; and work function of the first work function metal 120a may be smaller than work function of the second work function metal 122a. For example, work function of the first work function metal 120a may be smaller than work function of the first main metal 120b while work function of the second work function metal 122a may be greater than work function of the second main metal 122b. In some embodiment, the first work function metal 120a with lower work function (e.g., 4 eV) and the second work function metal 122a with higher work function (e.g., 5.5 eV) may include Tantalum (Ta), Tantalum nitride (TaN), titanium nitride (TiN) or combinations thereof; and the first main metal 120b and the second main metal 122b include tungsten (W) and so on. Work function of the first main metal 120b and the second main metal 122b may be 4.5 eV, for example.

Figure 1K:
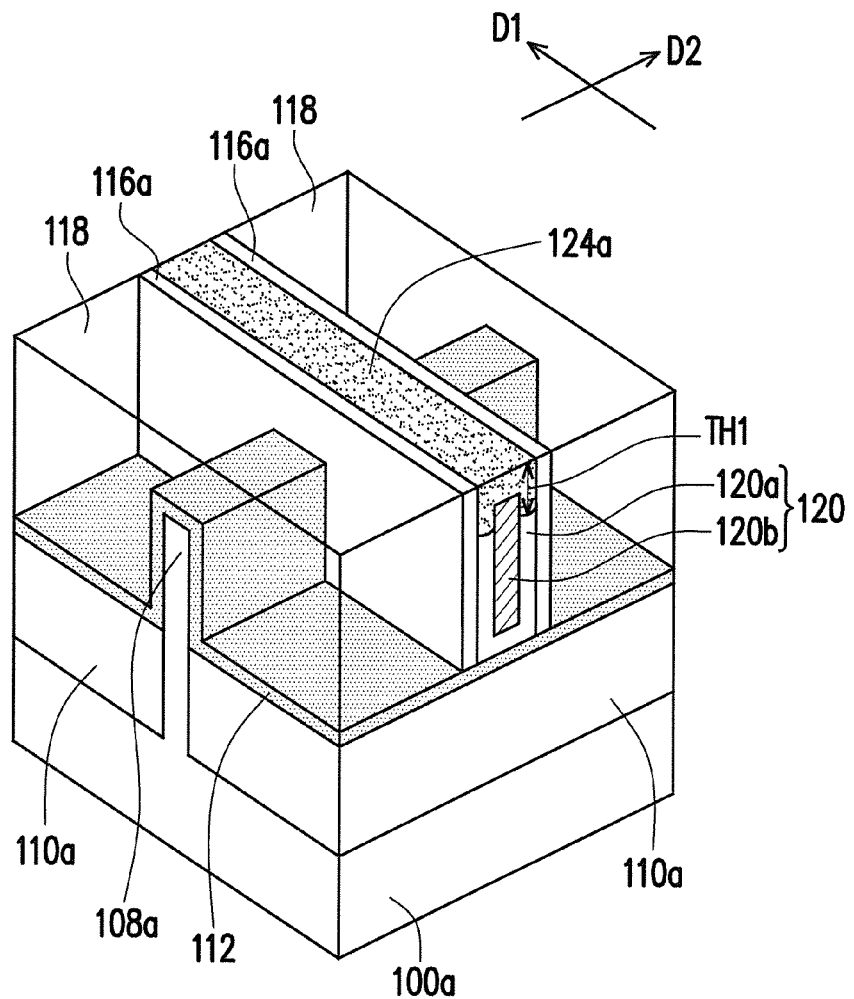
Figure 2K:
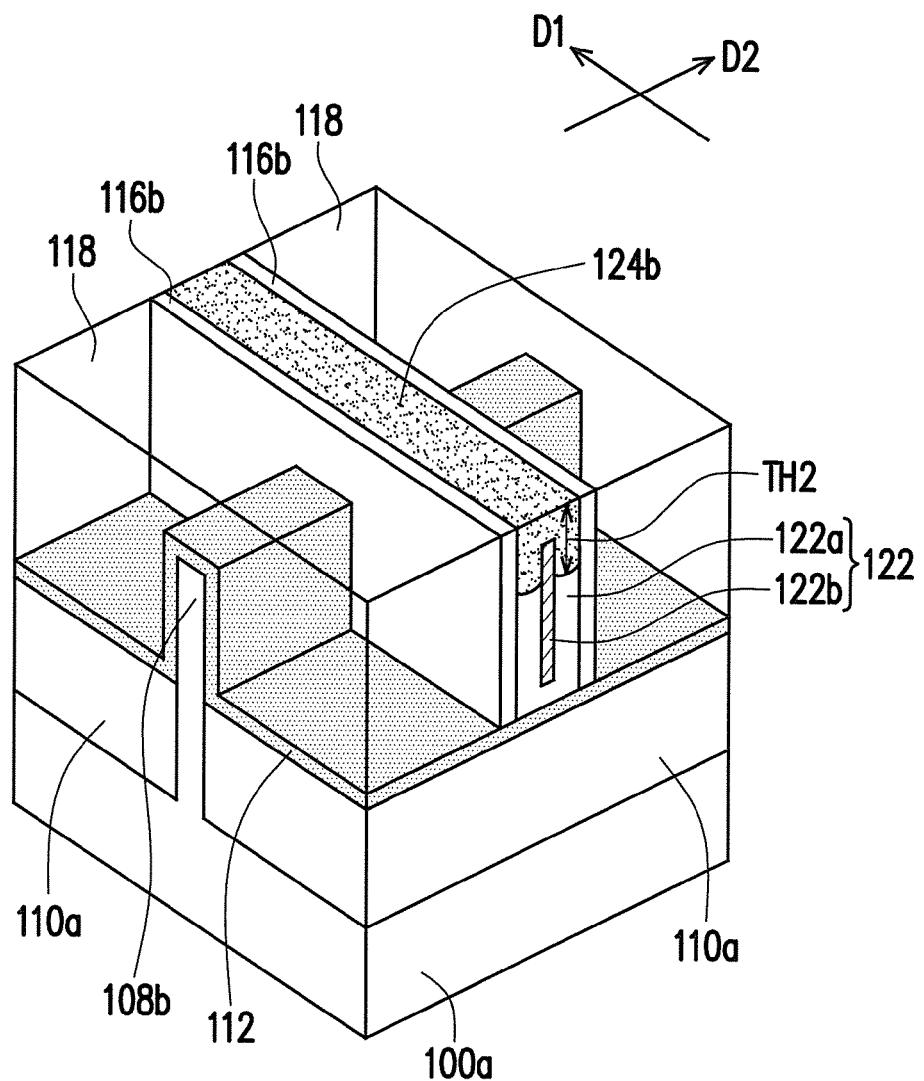

Referring to FIGS. 1J-1K and FIGS. 2J-2K, after the first metal gate 120 and between the pair of first spacers 116a and the second metal gate 122 between the pair of second spacers 116b are formed, a first dielectric cap 124a and a second dielectric cap 124b are formed in the first gate recess $G_{R1}$ and the second gate recess $G_{R2}$, respectively. The first dielectric cap 124a covers a top surface of the first metal gate 120 and the second dielectric cap 124b covers a top surface of the second metal gate 122. In other words, the first main metal 120b is embedded in the first work function metal 120a and the first dielectric cap 124a while the second main metal 122b is embedded in the second work function metal 122a and the second dielectric cap 124b. As shown in FIG. 1K and FIG. 2K, the maximum thickness TH1 of the first dielectric cap 124a is smaller than the maximum thickness TH2 of the second dielectric cap 124b.

After the first dielectric cap 124a is formed in the first gate recess $G_{R1}$, a first gate structure including the first metal gate 120 and the first dielectric cap 124a is formed on the gate dielectric layer 112, wherein the first main metal 120b extends into and is embedded in the first dielectric cap 124a. After the second dielectric cap 124b is formed in the second gate recess $G_{R2}$, a second gate structure including the second metal gate 122 and the second dielectric cap 124b is formed on the gate dielectric layer 112, wherein the second main metal 122b extends into and is embedded in the second dielectric cap 124b. The first gate structure and the second gate structure have the same overall thickness. In some embodiments, the pair of first spacers 116a which cover sidewalls of the first metal gate and the first dielectric cap 124a may be considered as parts of the first gate structure, and the pair of second spacers 116b which cover sidewalls of the second metal gate and the second dielectric cap 124b may be considered as parts of the second gate structure.

In the above-mentioned semiconductor device including at least one n-type FinFET and at least one p-type FinFET, process window of metal gate etch back process is enlarged. Accordingly, yield rate and reliability of the FinFETs are enhanced.

In accordance with some embodiments of the present disclosure, a semiconductor device comprising a substrate, a plurality of insulators, a gate dielectric layer, a first gate structure and a second gate structure is provided. The substrate comprises a plurality of trenches, a first semiconductor fin between the trenches and a second semiconductor fin between the trenches. The insulators are in the trenches. The gate dielectric layer covers the insulators, the first semiconductor fin and the second semiconductor fin. The first gate structure is disposed on the gate dielectric layer and partially covers the first semiconductor fin. The first gate structure comprises a first metal gate and a first dielectric cap covering a first top surface of the first metal gate. The second gate structure is disposed on the gate dielectric layer and partially covers the second semiconductor fin. The second gate structure comprises a second metal gate and a second dielectric cap covering a second top surface of the second metal gate. Work function of the first metal gate is smaller than work function of the second metal gate and thickness of the first dielectric cap is smaller than thickness of the second dielectric cap.

In accordance with alternative embodiments of the present disclosure, a semiconductor device comprising a substrate, a plurality of insulators, a gate dielectric layer, a first gate structure and a second gate structure is provided. The substrate comprises a plurality of trenches, a first semiconductor fin between the trenches and a second semiconductor fin between the trenches. The insulators are in the trenches. The gate dielectric layer covers the insulators, the first semiconductor fin and the second semiconductor fin. The first gate structure is disposed on the gate dielectric layer and partially covers the first semiconductor fin. The first gate structure comprises a pair of first spacers, a first metal gate and a first dielectric cap, wherein the first metal gate is disposed between the pair of first spacers, a first gate recess between the pair of first spacers is formed above the first metal gate, and the first dielectric cap fills the first gate recess. The second gate structure is disposed on the gate dielectric layer and partially covers the second semiconductor fin. The second gate structure comprises a pair of second spacers, a second metal gate and a second dielectric cap, wherein the second metal gate is disposed between the pair of second spacers, a second gate recess between the pair of second spacers is formed above the second metal gate, and the second dielectric cap fills the second gate recess. Work function of the first metal gate is smaller than work function of the second metal gate and thickness of the first dielectric cap is smaller than thickness of the second dielectric cap.

In accordance with yet alternative embodiments of the present disclosure, a FinFET comprising a substrate, a plurality of insulators, a gate dielectric layer, a first gate structure and a second gate structure is provided. The substrate comprises a plurality of trenches, a first semiconductor fin between the trenches and a second semiconductor fin between the trenches. The insulators are in the trenches. The gate dielectric layer covers the insulators, the first semiconductor fin and the second semiconductor fin. The first gate structure is disposed on the gate dielectric layer and partially covers the first semiconductor fin. The first gate structure comprises a first work function metal disposed on the gate dielectric layer, a first main metal and a first dielectric cap, wherein the first main metal is embedded in the first work function metal and the first dielectric cap. The second gate structure is disposed on the gate dielectric layer and partially covers the second semiconductor fin. The second gate structure comprises a second work function metal disposed on the gate dielectric layer, a second main metal and a second dielectric cap, wherein the second main metal is embedded in the second work function metal and the second dielectric cap. Work function of the first work function metal is smaller than work function of the second work function metal and thickness of the first dielectric cap is smaller than thickness of the second dielectric cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a plurality of trenches, a first semiconductor fin between the trenches and a second semiconductor fin between the trenches;
a plurality of insulators in the trenches;
a gate dielectric layer covering the insulators, the first semiconductor fin and the second semiconductor fin;
a first gate structure disposed on the gate dielectric layer and partially covering the first semiconductor fin, the first gate structure comprising a first metal gate and a first dielectric cap covering a first top surface of the first metal gate, wherein the first metal gate comprises a first protrusion extending into the first dielectric cap; and
a second gate structure disposed on the gate dielectric layer and partially covering the second semiconductor fin, the second gate structure comprising a second metal gate and a second dielectric cap covering a second top surface of the second metal gate, wherein work function of the first metal gate is smaller than work function of the second metal gate, and the second metal gate comprises a second protrusion extending into the second dielectric cap.

2. The semiconductor device of claim 1, wherein the first semiconductor fin is an n-type doped semiconductor fin and the second semiconductor fin is a p-type doped semiconductor fin.

3. The semiconductor device of claim 1, wherein thickness of the first gate structure equals to thickness of the second gate structure.

4. The semiconductor device of claim 1, wherein the first gate structure further comprises a pair of first spacers covering sidewalls of the first metal gate and the first dielectric cap, and the second gate structure further comprises a pair of second spacers covering sidewalls of the second metal gate and the second dielectric cap.

5. The semiconductor device of claim 1, wherein the first metal gate comprises a first work function metal disposed on the gate dielectric layer and a first main metal embedded in the first work function metal, the second metal gate comprises a second work function metal disposed on the gate dielectric layer and a second main metal embedded in the first work function metal, and work function of the first work function metal is smaller than work function of the second work function metal.

6. The semiconductor device of claim 5, wherein work function of the first main metal equals to work function of the second main metal.

7. The semiconductor device of claim 5, wherein the first main metal extends into the first dielectric cap and the second main metal extends into the second dielectric cap.

8. The semiconductor device of claim 5, wherein width of the first main metal is greater than width of the second main metal.

9. A semiconductor device, comprising:
a substrate comprising a plurality of trenches, a first semiconductor fin between the trenches and a second semiconductor fin between the trenches;
a plurality of insulators in the trenches;
a gate dielectric layer covering the insulators, the first semiconductor fin and the second semiconductor fin;
a first gate structure disposed on the gate dielectric layer and partially covering the first semiconductor fin, the first gate structure comprising a pair of first spacers, a first metal gate and a first dielectric cap, the first metal gate being disposed between the pair of first spacers, a first gate recess between the pair of first spacers being formed above the first metal gate, and the first dielectric cap filling the first gate recess, wherein the first metal gate comprises a first protrusion extending into the first dielectric cap; and
a second gate structure disposed on the gate dielectric layer and partially covering the second semiconductor fin, the second gate structure comprising a pair of second spacers, a second metal gate and a second dielectric cap, the second metal gate being disposed between the pair of second spacers, a second gate recess between the pair of second spacers being formed above the second metal gate, the second dielectric cap filling the second gate recess, wherein work function of the first metal gate is smaller than work function of the second metal gate, and the second metal gate comprises a second protrusion extending into the second dielectric cap.

10. The semiconductor device of claim 9, wherein the first semiconductor fin is an n-type doped semiconductor fin and the second semiconductor fin is a p-type doped semiconductor fin.

11. The semiconductor device of claim 9, wherein thickness of the first gate structure equals to thickness of the second gate structure.

12. The semiconductor device of claim 9, wherein the first metal gate comprises a first work function metal disposed on the gate dielectric layer and a first main metal embedded in the first work function metal, the second metal gate comprises a second work function metal disposed on the gate dielectric layer and a second main metal embedded in the first work function metal, and work function of the first work function metal is smaller than work function of the second work function metal.

13. The semiconductor device of claim 12, wherein work function of the first main metal equals to work function of the second main metal.

14. The semiconductor device of claim 12, wherein the first main metal extends into the first dielectric cap and the second main metal extends into the second dielectric cap.

15. The semiconductor device of claim 12, wherein width of the first main metal is greater than width of the second main metal.

16. The semiconductor device of claim 9, wherein depth of the first gate recess is smaller than depth of the second gate recess.

17. A semiconductor device, comprising:
a substrate comprising a plurality of trenches, a first semiconductor fin between the trenches and a second semiconductor fin between the trenches;
a plurality of insulators in the trenches;
a gate dielectric layer covering the insulators, the first semiconductor fin and the second semiconductor fin;
a first gate structure disposed on the gate dielectric layer and partially covering the first semiconductor fin, the first gate structure comprising a first work function metal disposed on the gate dielectric layer, a first main metal and a first dielectric cap, the first main metal being embedded in the first work function metal and the first dielectric cap, wherein the first main metal extends into the first dielectric cap; and
a second gate structure disposed on the gate dielectric layer and partially covering the second semiconductor fin, the second gate structure comprising a second work function metal disposed on the gate dielectric layer, a second main metal and a second dielectric cap, the second main metal being embedded in the second work function metal and the second dielectric cap, wherein work function of the first work function metal is smaller than work function of the second work function metal, and the second main metal extends into the second dielectric cap.

18. The semiconductor device of claim 17, wherein the first semiconductor fin is an n-type doped semiconductor fin and the second semiconductor fin is a p-type doped semiconductor fin.

19. The semiconductor device of claim 17, wherein work function of the first main metal equals to work function of the second main metal.

20. The semiconductor device of claim 17, wherein width of the first main metal is greater than width of the second main metal.

* * * * *